United States Patent
Caldeira et al.

(10) Patent No.: US 9,691,500 B2
(45) Date of Patent: Jun. 27, 2017

(54) CASIMIR EFFECT MEMORY CELL

(71) Applicant: Elwha LLC, Bellevue, WA (US)

(72) Inventors: Kenneth G. Caldeira, Redwood City, CA (US); Peter L. Hagelstein, Carlisle, MA (US); Roderick A. Hyde, Redmond, WA (US); Muriel Y. Ishikawa, Livermore, CA (US); Edward K. Y. Jung, Bellevue, WA (US); Jordin T. Kare, San Jose, CA (US); Nathan P. Myhrvold, Medina, WA (US); John Brian Pendry, Cobham (GB); David Schurig, Salt Lake City, UT (US); Clarence T. Tegreene, Mercer Island, WA (US); David B. Tuckerman, Lafayette, CA (US); Thomas Allan Weaver, San Mateo, CA (US); Charles Whitmer, North Bend, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 14/853,044

(22) Filed: Sep. 14, 2015

(65) Prior Publication Data

US 2017/0076822 A1  Mar. 16, 2017

(51) Int. Cl.
| | |
|---|---|
| *G11C 23/00* | (2006.01) |
| *G11C 11/50* | (2006.01) |
| *G11C 11/21* | (2006.01) |
| *H01H 57/00* | (2006.01) |

(52) U.S. Cl.
CPC .............. *G11C 23/00* (2013.01); *G11C 11/21* (2013.01); *G11C 11/50* (2013.01); *H01H 57/00* (2013.01)

(58) Field of Classification Search
CPC ......... G11C 23/00; G11C 11/21; G11C 11/30; G11C 11/48; G11C 11/50; G11C 17/00
USPC ................ 365/129, 160, 164; 200/181, 600; 438/685; 458/674; 488/903
See application file for complete search history.

(56) References Cited

U.S. PATENT DOCUMENTS

| | | | |
|---|---|---|---|
| 8,735,750 B2 * | 5/2014 | Ng ........................ | H01H 1/0094 200/181 |
| 2006/0028966 A1 | 2/2006 | Szu | |
| 2010/0061143 A1 * | 3/2010 | Carley ................ | B81C 1/00198 365/154 |
| 2010/0142259 A1 * | 6/2010 | Drndic .................. | B82Y 10/00 365/158 |

(Continued)

*Primary Examiner* — Tan T. Nguyen
(74) *Attorney, Agent, or Firm* — Foley & Lardner LLP

(57) ABSTRACT

A digital memory device includes a moveable element that is configured to move between a first stable position and a second stable position, where the moveable element comprises a first conducting area. The digital memory device further includes a second conducting area on the surface of a substrate. At the first stable position of the moveable element, a first gap exists between the first conducting area and the second conducting area. At the second stable position of the moveable element, a second gap that is smaller than the first gap exists between the first conducting area and the second conducting area. In at least the second stable position, an attractive Casimir force between the moveable element and the substrate holds the moveable element in the stable position.

32 Claims, 7 Drawing Sheets

(56) References Cited

U.S. PATENT DOCUMENTS

2010/0165737 A1\* 7/2010 Yun ................... H01L 27/10
  365/185.18

\* cited by examiner

CASIMIR EFFECT MEMORY CELL

BACKGROUND

The Casimir effect is a nonlinear attractive force between conducting plates that arises from a quantized vacuum field around the plates. Such a force can be induced by virtual photons that fill the vacuum field, and the force varies based on the separation between the conducting surfaces of the plates. Certain photon modes are forbidden from the area of the separation between the plates, as these modes have wavelengths that are too large to fit within the separation. Due to this phenomenon, the energy density is lower between the plates than it is outside the plates, and a pressure is formed that pushes the plates together.

SUMMARY

One embodiment relates to a digital memory device. The digital memory device comprises a moveable element configured to move between a first stable position and a second stable position. The moveable element may comprise a first conducting area. The digital memory device further comprises a second conducting area on the surface of a substrate. At the first stable position of the moveable element, a first gap exists between the first conducting area and the second conducting area. At the second stable position of the moveable element, a second gap that is smaller than the first gap exists between the first conducting area and the second conducting area. In at least the second stable position, an attractive Casimir force between the moveable element and the substrate holds the moveable element in the stable position. In some embodiments, the Casimir force is used to make the digital memory device stable and hold the elements (e.g., moveable element) of the digital memory device in a stable setting. For example, the moveable element may be connected to a spring, but Casimir force is greater than a force of the spring and causes the moveable element to move towards the substrate. The moveable element and the substrate are separated by a spacer and as the moveable element moves towards the substrate it hits the spacer. Instead, of rebounding or bouncing off of the spacer, the Casimir force holds the moveable element against the spacer. To reverse or reset the memory cell, the Casimir force can be turned off or a spring force may be applied in a reverse direction causing the moveable element to move away from the substrate and the spacer.

Another embodiment relates to a digital data storage device that comprises a plurality of digital memory cells connected together in an array. Each digital memory cell comprises a moveable element configured to move between a first stable position and a second stable position, where a position of the moveable element represents a state, and where the moveable element comprises a first conducting area. Each digital memory cell further comprises a second conducting area on the surface of a substrate, where at the first stable position of the moveable element, a first gap exists between the first conducting area and the second conducting area, and where at the second stable position of the moveable element, a second gap that is smaller than the first gap exists between the first conducting area and the second conducting area. In at least the second stable position, an attractive Casimir force between the moveable element and the substrate holds the moveable element in the stable position. The digital data storage device further comprises a memory addressing mechanism comprising a memory reading element configured to read a state of one or more digital memory devices of the array, and a memory writing element configured to change the state of the one or more digital memory cells of the array.

Another embodiment relates to a method of providing a digital memory cell. The method comprises providing a moveable element configured to move between a first stable position and a second stable position, where the moveable element comprises a first conducting area. The method further comprises providing a second conducting area on the surface of a substrate, where at the first stable position of the moveable element, a first gap exists between the first conducting area and the second conducting area, and where at the second stable position of the moveable element, a second gap that is smaller than the first gap exists between the first conducting area and the second conducting area. The method further comprises transitioning the moveable element from the first stable position to the second stable position. In at least the second stable position, an attractive Casimir force between the moveable element and the substrate holds the moveable element in the stable position.

Another embodiment relates to a method of providing a data storage device. The method comprises providing a plurality of digital memory cells. Each digital memory cell comprises a moveable element configured to move between a first stable position and a second stable position, where a position of the moveable element represents a state, and where the moveable element comprises a first conducting area. Each digital memory cell further comprises a second conducting area on the surface of a substrate, where at the first stable position of the moveable element, a first gap exists between the first conducting area and the second conducting area, and where at the second stable position of the moveable element, a second gap that is smaller than the first gap exists between the first conducting area and the second conducting area. In at least the second stable position, an attractive Casimir force between the moveable element and the substrate holds the moveable element in the stable position. The method further comprises arranging the plurality of digital memory cells into an array and providing a memory addressing mechanism. The memory addressing mechanism comprises a memory reading element configured to read a state of one or more digital memory devices of the array, and a memory writing element configured to change the state of the one or more digital memory devices of the array.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
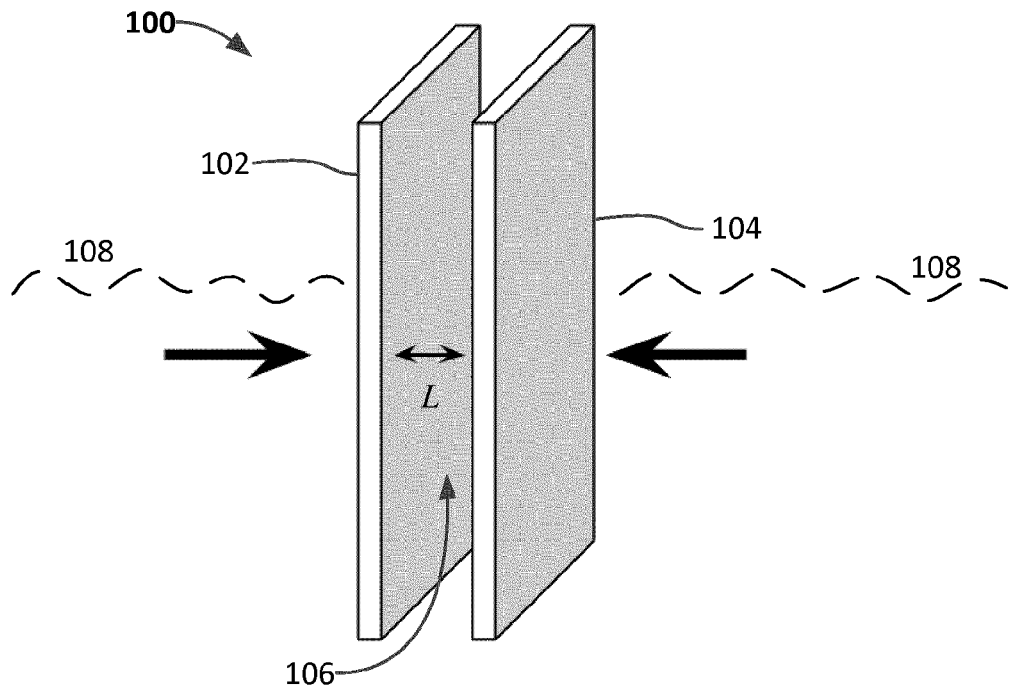
FIG. 1 is a diagram of the Casimir effect on two conducting plates.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the scope of the subject matter presented here.

Referring generally to the figures, various embodiments of a Casimir effect memory cell are shown and described. The Casimir effect is an attractive force that arises in a vacuum space, which is filled by virtual photons. In general, the modes of the virtual photons are uniform in direction, and there is no Casimir effect. However, if at least two conducting surfaces are introduced into the space, and the conducting surfaces are arranged sufficiently close together (e.g., parallel) to form a cavity therebetween, photon modes of wavelengths that are larger than the cavity are forbidden from existing within the cavity. As a result, the energy density (i.e., the virtual radiation from the virtual photons) is lower in the cavity than it is outside the conducting surfaces, which materializes as a pressure from the higher energy density outside the cavity that pushes the surfaces together.

Although the resulting Casimir force is present, it is negligible until the conducting surfaces are spaced sufficiently close together. The Casimir force is inversely proportional to the fourth power of the separation between the conducting surfaces (the Casimir varies according to $L^{-4}$, where L equals the separation between the conducting surfaces). Thus, to obtain a measurable effect, the conducting surfaces generally need to be spaced at a separation on the nanometer scale (or smaller). An example physical scale at which the Casmir force is significant is for a conducting surface spacing of 10 nanometers.

Referring to FIG. 1, a diagram 100 depicts the Casimir effect on two conducting plates. Diagram 100 includes a first conducting plate 102 and a second conducting plate 104. Conducting plates 102 and 104 are shown as being separated by a distance of L to form cavity 106, and conducting plates 102 and/or 104 may be formed on the surface of a substrate. In one embodiment, the distance L is at the nanometer scale (e.g., 1 nanometer (nm) or less, 5 nm or less, 10 nm or less, etc.). Conducting plates 102 and 104 may be enclosed by a vacuum field 108, which is filled with virtual photons. At the distance of L, certain modes of the virtual photons of field 108 (e.g., modes having a wavelength greater than L) cannot fit within cavity 106. Because the certain modes cannot fit within cavity 106, the energy density within cavity 106 is less than the energy density in field 108, and a force is exerted on the outside of plates 102 and 104 that is greater than the force exerted on the inside of plates 102 and 104, which pushes plates 102 and 104 together.

Figure 2:
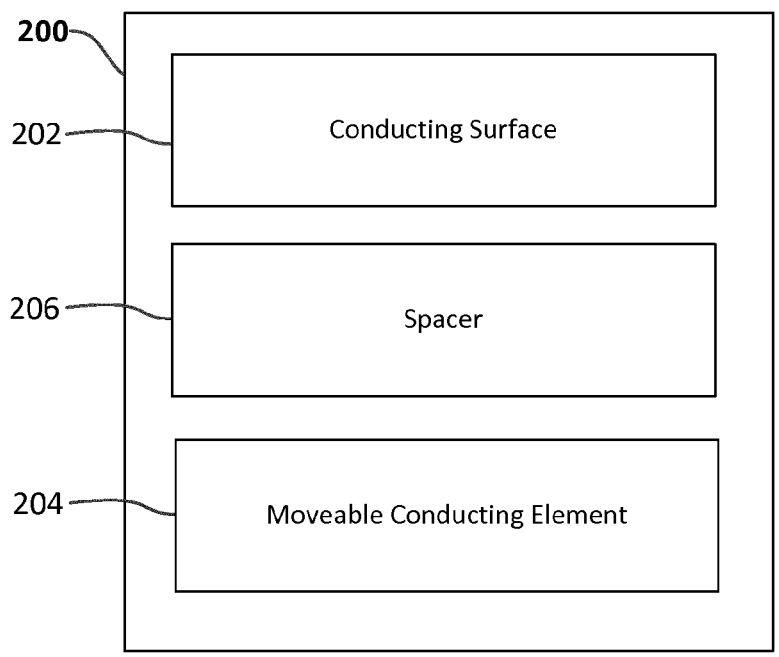
FIG. 2 is a block diagram of a Casimir effect memory cell, according to one embodiment.

Referring to FIG. 2, a block diagram of Casimir effect memory cell 200 is shown, according to one embodiment. Casimir effect memory cell 200 includes at least one conducting surface 202 and a moveable conducting element 204. In one embodiment, conducting surface 202 is nominally flat and moveable conducting element 204 includes a conducting area that is parallel to conducting surface 202. Moveable conducting element 204 may be a conducting area on the surface of a disk or plate, and may move in a perpendicular manner with respect to an area of conducting surface 202. Moveable conducting element 204 may include a mechanically moving element (e.g., an arm, a supporting element, etc.), or moveable conducting element 204 may be part of a flexible material (e.g., a portion of a flexible conducting sheet, etc.). In another embodiment, moveable conducting element 204 is a portion of a comparatively large sheet that is either contiguous or partially separated (e.g., a disk surrounded by an etched gap with supporting elements, etc.). In one embodiment, moveable conducting element 204 has an area ranging from about 10 $nm^2$ to about 1000 $nm^2$. In one embodiment, moveable conducting element may have an area of 100 $nm^2$.

The moveable conducting element 204 may be held away from conducting surface 202 (i.e., opposing a Casimir force) by another non-Casimir force. In one embodiment, a spring force of the material comprising moveable conducting element 204 may be used to push conducting surface 202 and moveable conducting element 204 apart. In another embodiment, an electromagnetic force may be induced to push conducting surface 202 and moveable conducting element 204 apart. In another embodiment, the spring force of the material of moveable conducting element 204 (or of supporting elements) may be used to maintain a position of moveable conducting element 204.

The interaction of the non-Casimir force and the non-linear Casimir force may be taken advantage of such that moveable conducting element 204 may be positioned in at least two stable states (i.e. positions). For example, when conducting surface 202 and moveable conducting element 204 are sufficiently close together, the Casimir force dominates over the non-Casimir force, and conducting surface 202 and moveable conducting element 204 can be pushed together into a first stable position. However, when conducting surface 202 and moveable conducting element 204 are separated at more than a critical distance (i.e., the distance at which the non-Casimir force is stronger than the Casimir force), then the non-Casmir force dominates, and conducting surface 202 and moveable conducting element 204 can be pushed apart into a second stable position. The gap between the conducting surface 202 and moveable conducting element 204 may be smaller when in the first stable position than it is in the second stable position.

In some embodiments, the Casimir effect memory cell 200 may include two opposing stationary surfaces and the moveable conducting element 204 positioned between the two opposing stationary surfaces. For example, the Casimir effect memory cell 200 may include two conducting surfaces 202 with the moveable conducting element 204 positioned between the two conducting surfaces 202. In other embodiments, the Casimir effect memory cell 200 may include two opposing stationary surfaces and two moveable conducting elements 204 positioned between the two opposing stationary surfaces.

Thus, in an embodiment having two stable states, binary data may be stored based on the positioning of moveable conducting element 204 and whether it is in the first or second stable position. Casimir effect memory cell 200 may be "set" to an "on" position by any means of applying an inward force to moveable conducting element 204 such that the Casimir force dominates and conducting surface 202 and moveable conducting element 204 are pushed (and remain) together. In one embodiment, electromagnetic or electrostatic attraction (directed towards conducting surface 202) is utilized. In another embodiment, repulsion from a third surface (that is positioned opposite conducting surface 202) is utilized. In another embodiment, photon pressure may be utilized to move moveable conducting element 204. In another embodiment, mechanical pressure (e.g., from an atomic force microscopy (AFM) tip or a microelectromechanical system (MEMS) actuator, etc.) may be utilized. In another embodiment, the non-Casimir force may be reduced (e.g., via the application of heat, etc.) so that the Casimir force dominates over the non-Casimir force. In another embodiment, a Casimir force from an additional moveable element may be used to move moveable conducting element 204. Casimir effect memory cell 200 may be "reset" to an "off" position by any means of applying outward force such that conducting surface 202 and moveable conducting element 204 are pushed (and remain) apart. In one embodiment, electromagnetic or electrostatic attraction (directed towards moveable conducting element 204) is utilized. In another embodiment, photon pressure may be utilized to move moveable conducting element 204 away from conducting surface 202 and overcome the Casimir force. In another embodiment, the Casimir force may be altered by dynamically adjusting Casimir properties of conducting surface 202 or moveable conducting element 204, which may include changing the conductive or insulating properties of conducting surface 202 or moveable conducting element 204. For example, the Casimir force may be reduced (e.g., via dynamically reducing the conductivity of the conducting elements) so that the non-Casimir force takes over.

The state of Casimir effect memory cell 200 may be read in various manners. One or more properties of Casimir effect memory cell 200 may be measured in order to read the state of the cell. For example, electrical conductance, a resistance, a capacitance, a thermal conductance, an optical reflection or transmission, and a mechanical position may each be measured for the cell or for individual components of the cell. In one embodiment, Casimir effect memory cell 200 may be read by sensing the separation of the conducting elements of the cell (e.g., the displacement of moveable conducting element 204). In one embodiment, the displacement may be sensed optically, electrically, or mechanically (e.g., by a scanning tunneling microscope (STM) tip). In another embodiment, an electrical contact (e.g., a conduction or capacitance) or tunneling between conducting surface 202 and moveable conducting element 204 may be sensed. For example, as moveable conducting element 204 moves closer and further from conducting surface 202, the capacitance between conducting element 204 and conducting surface 202 changes, which can be measured to determine the state of Casimir effect memory cell 200.

In some embodiments, the electrical contact may be attached to the moveable conducting element 204. In other embodiments, a separate element that provides an electrical contact may be attached to the moveable conducting element 204 that provides the electrical contact or other indicator (e.g., capacitance charge, resistance charge, etc.) of the position of the moveable conducting element 204. The separate element or electrical contact may move when the moveable conducting element 204 changes position, but may not be directly affected by the Casimir effect due to its composition or distances from other surfaces.

In certain embodiments moveable conducting element 204 may be configured to only rest in the first or second stable positions. However, it should also be understood that the scope of the present disclosure is not limited to embodiments having a moveable conducting element 204 that is only capable of being set in two stable positions. For example, in one embodiment, moveable conducting element 204 may be positioned in one or more stable intermediate positions in addition to the two stable positions discussed above. Any of the positions of moveable conducting element 204 may be set and read out.

Figure 3:
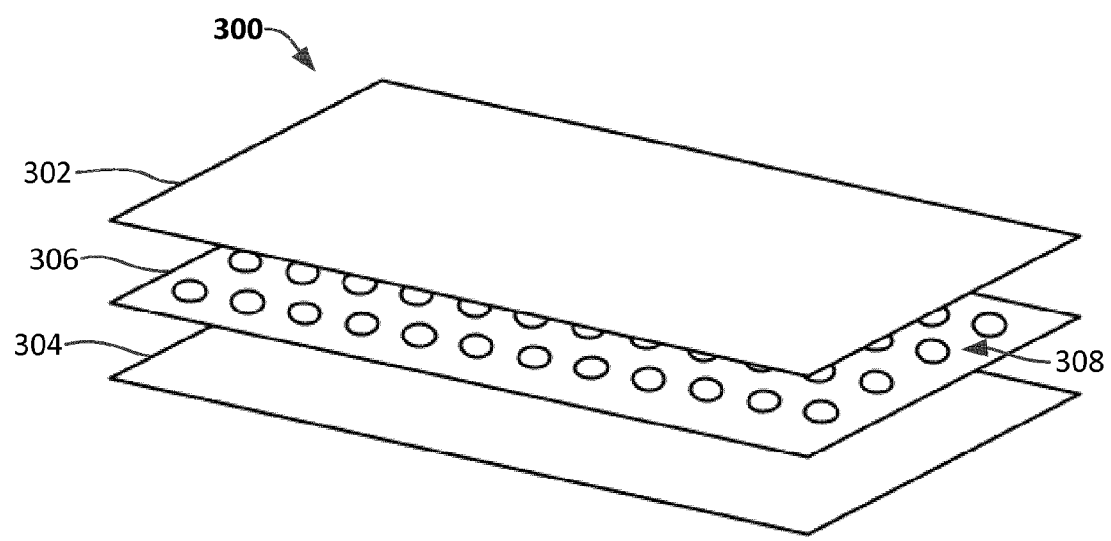
FIG. 3 is a block diagram of a Casimir effect memory cell, according to one embodiment.

Referring to FIG. 3, Casimir effect memory cell 300 is shown according to one embodiment. Casimir effect memory cell 300 includes a first conducting sheet 302 and a second conducting sheet 304. In between conducting sheets 302 and 304 is a spacer 306. In one embodiment, spacer 306 is a dielectric. Spacer 306 may be attached to conducting sheets 302 or 304 (e.g., spacer 306 may be attached to a moveable element or a substrate of the cell). Spacer 306 may vary in thickness according to the amount of force desired to "set" and "reset" Casimir effect memory cell 300 (e.g., the force required to overcome the Casimir force between conducting sheets 302 and 304, etc.). In one embodiment, spacer 306 is 10-20 nm thick. Spacer 306 includes periodically spaced holes 308 of diameter d formed therethrough. In some embodiments, the diameter d ranges from about 3 nm to about 100 nm. For example, in one embodiment, the diameter d is 20 nm. In another embodiment, the diameter d is 30 nm. In some embodiments, the holes 308 may be circular, oval, square, rectangular, or otherwise shaped. In the configuration depicted in FIG. 3, absent any additional forces, conducting sheets 302 and 304 do not touch due to the presence of spacer 306. However, when moved closer to each other (e.g., via pushing sheets 302 and/or 304 through one or more holes 308), conducting sheets 302 and 304 snap together due to the Casimir force as described above. Once conducting sheets 302 and 304 are coupled together by the Casimir force, they remain together until pushed apart again (e.g., when Casimir effect memory cell 300 is reset by an additional force). Conducting sheet 302 and/or conducting sheet 304 may be moveable/flexible such that conducting sheet 302 and/or conducting sheet 304 may be pushed through one or more of the holes 308 in spacer 306. In one embodiment, Casimir effect memory cell 300 includes multiple spacers 306.

The scope of the present application is not limited to a particular type of spacer 306, and other spacers 306 may be used. In one embodiment, spacer 306 is in the form of bumps on one or both of conducting sheet 302 and conducting sheet 304. Additionally, spacer 306 may be homogenous in material (e.g., the same material as conducting sheet 302 and/or conducting sheet 304), heterogeneous (e.g., a different material than conducting sheet 302 and/or conducting sheet 304), or spacer 306 may include continuous layers (e.g., a dielectric) between conducting sheets 302 and 304. As one example, spacer 306 may be in the form of nanoparticles or deposited pads on conducting sheet 302 and/or conducting sheet 304.

In one embodiment, multiple Casimir effect memory cells may be connected together in an array to form a data storage device. In general, such a data storage device consists of the array of Casimir effect memory cells, and an addressing mechanism that is capable of reading and changing (e.g., setting, resetting, etc.) the states of specific memory cell or a group of memory cells. The array may be a one-dimensional, two-dimensional, or three-dimensional array (e.g., a stack of two-dimensional layers), and the addressing mechanism may correspond to the configuration of the array. For example, the addressing mechanism may be one-dimensional (e.g., a row or matrix of read/write probes). As another example, the addressing mechanism may be two-dimensional or three-dimensional (e.g., using a coincident current or active device). As another example, the addressing mechanism may be a single-point addressing mechanism (e.g. using a laser beam or scanning microscope tip). As another example, the addressing mechanism may be a scanning mechanism (e.g., using a confocal laser). In one embodiment, the moving elements of the Casimir effect memory cells may be connected together (e.g., formed as conducting stripes) in one direction (X) and the corresponding conducting elements of the Casimir effect memory cells may be connected together in an orthogonal (Y) direction. Accordingly, X-Y addressing (which in some embodiments may require nonlinear elements at each Casimir effect memory cell, such as a diode, FET, or tunneling gap, etc.) may be used to access the array of Casimir effect memory cells.

Figure 4:
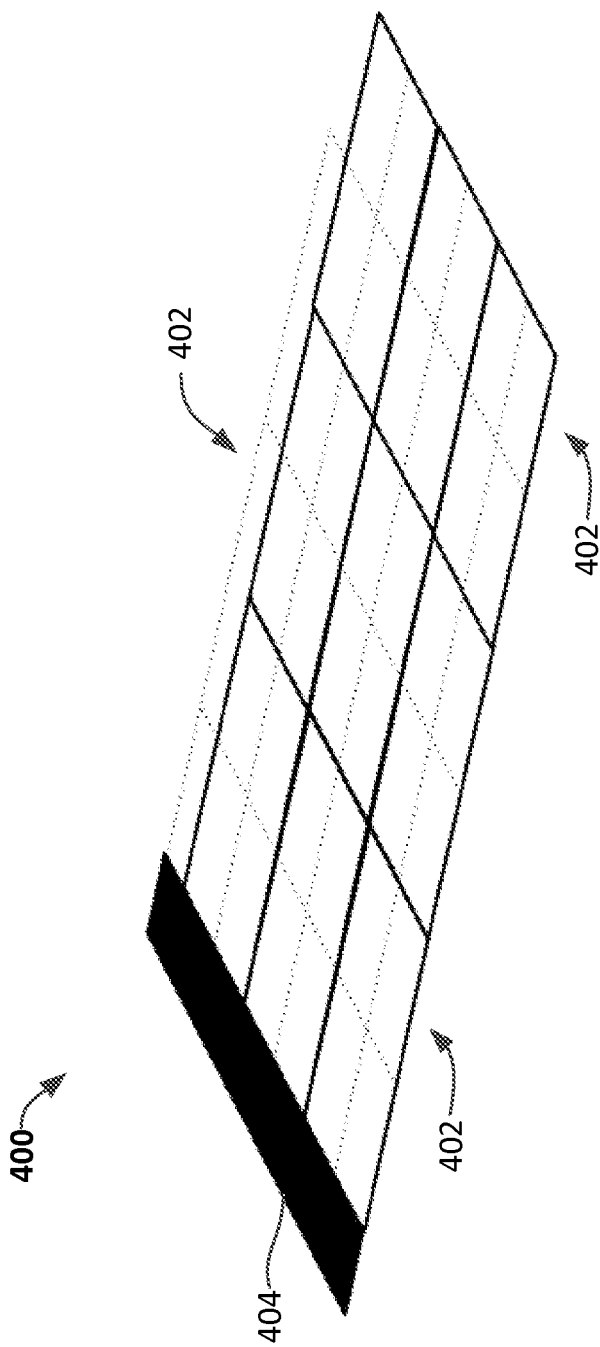
FIG. 4 is a block diagram of a data storage device, according to one embodiment.

Referring to FIG. 4, a data storage device 400 is shown according to one embodiment. Data storage device 400 is formed from a plurality of Casimir effect memory cells 402. In one embodiment, the Casimir effect memory cells 402 are connected together into an array of rows and columns that can be accessed by addressing mechanism 404. For each row and column, a Casimir effect memory cell exists that may be set, reset, and read, as discussed herein. For example, in one embodiment the conducting element and moveable element of each Casimir effect memory cell may be positioned at the intersection of each row and column. An opposite voltage may then be applied (e.g., via addressing mechanism 404) to a conducting element and moveable element (or a group of conducting elements and moveable elements) in order to cause the conducting element and moveable element to attract electromagnetically as capacitor plates.

When the conducting element and moveable element are close enough, the two remain pushed together and set (even after ceasing the application of voltage) as a result of the Casimir force between the elements. The voltage applied to either the conducting element or moveable element can then be reversed, which causes the conducting element and moveable element to be pushed apart to overcome the Casimir force, and resets the configuration of the conducting element and moveable element. Accordingly, in this arrangement, each memory cell may be set or reset individually or as part of a group of memory cells. In another embodiment, the Casimir effect memory cells 402 of data storage device 400 may be configured to be globally reset. For example, changes in temperature or light level, or application of electric or magnetic fields, may be used to cause all of the moveable elements of Casimir effect memory cells 402 to relax to their respective "off" positions.

The Casimir effect memory cells 402 of data storage device 400 may function in any number of memory configurations. In one embodiment, data storage device 400 is configured to function as programmable read-only memory (PROM), where the state changes of the respective Casimir effect memory cells 402 are in one direction and are irreversible. In one embodiment, data storage device 400 is configured to function as erasable programmable read-only memory (EPROM), where the state changes of the respective Casimir effect memory cells 402 are in one direction but are reversible in groups or bulk. In one embodiment, the selection of Casimir effect memory cells 402 by addressing mechanism 404 is random, and data storage device 400 is configured to function as random-access memory (RAM). In one embodiment, the selection of Casimir effect memory cells 402 by addressing mechanism 404 is sequential or otherwise constrained.

Figure 5:
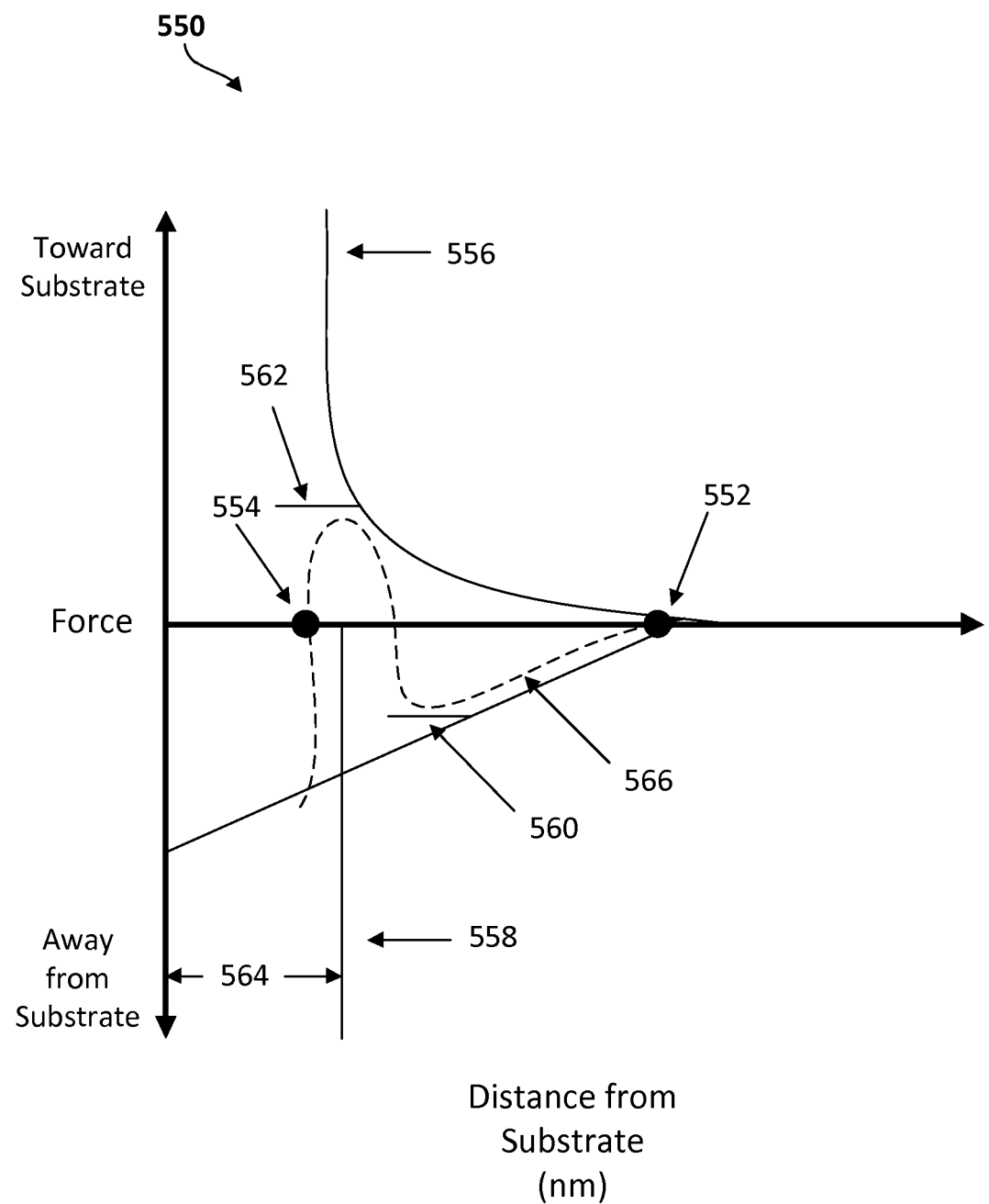
FIG. 5 is a graph depicting the forces on a Casimir memory moving element, according to one embodiment.

Referring to FIG. 5, an embodiment of a graph 550 depicting the forces on a Casimir memory moving element is shown. A Casimir memory cell may include a moving element, a substrate, and a spacer positioned between the moving element and the substrate to keep the moving element and substrate separated. In the graph 550, the forces on the moving element are represented by the Y-axis and the distance (in nanometers) between the moving element and the substrate is represented by the X-axis. The moving element can be configured to move from a first stable position 552 to a second stable position 554 in the Casimir memory cell. For example, in the graph 550, the moving element may be initially at the first stable position 552. A voltage may be applied to the moving element and the substrate causing the moving element and the substrate to be attracted. The attraction causes the moving element to change position from the first stable position 552 to the second stable position 554. At the second stable position 554, the moving element is separated from the substrate by the thickness 564 of the spacer layer.

The moving element may transition from the first stable position to the second stable position based on the various forces applied to it, such as a Casimir force 556, a contact force 558 between the moving element and the spacer, and an elastic force 566 on the moving element. The Casimir force 556 is represented by the formula $f=cd^{-4}$. The elastic (spring) force 566 on the moving element is represented by the formula $f=k_1(d-d_1)$. The contact force 558 between the moving element and the spacer is represented by the formula $f=k_2(d-t)$, where $k_2 \gg k_1$. In some embodiments, the contact force 558 includes a spring force from material of a spring in the memory cell or the material of a connecting element (e.g., spacer) in the memory cell or a combination of the two. As the moving element transitions back and forth between the first stable position and the second stable position, these forces affect the ability to set or reset the memory cell. For example, in the graph 550 of FIG. 5B, the dotted line represents the force needed to either set or reset the memory cell, including the external forces 562 needed to reset the cell and the external forces 560 needed to set the memory cell.

Figure 6:
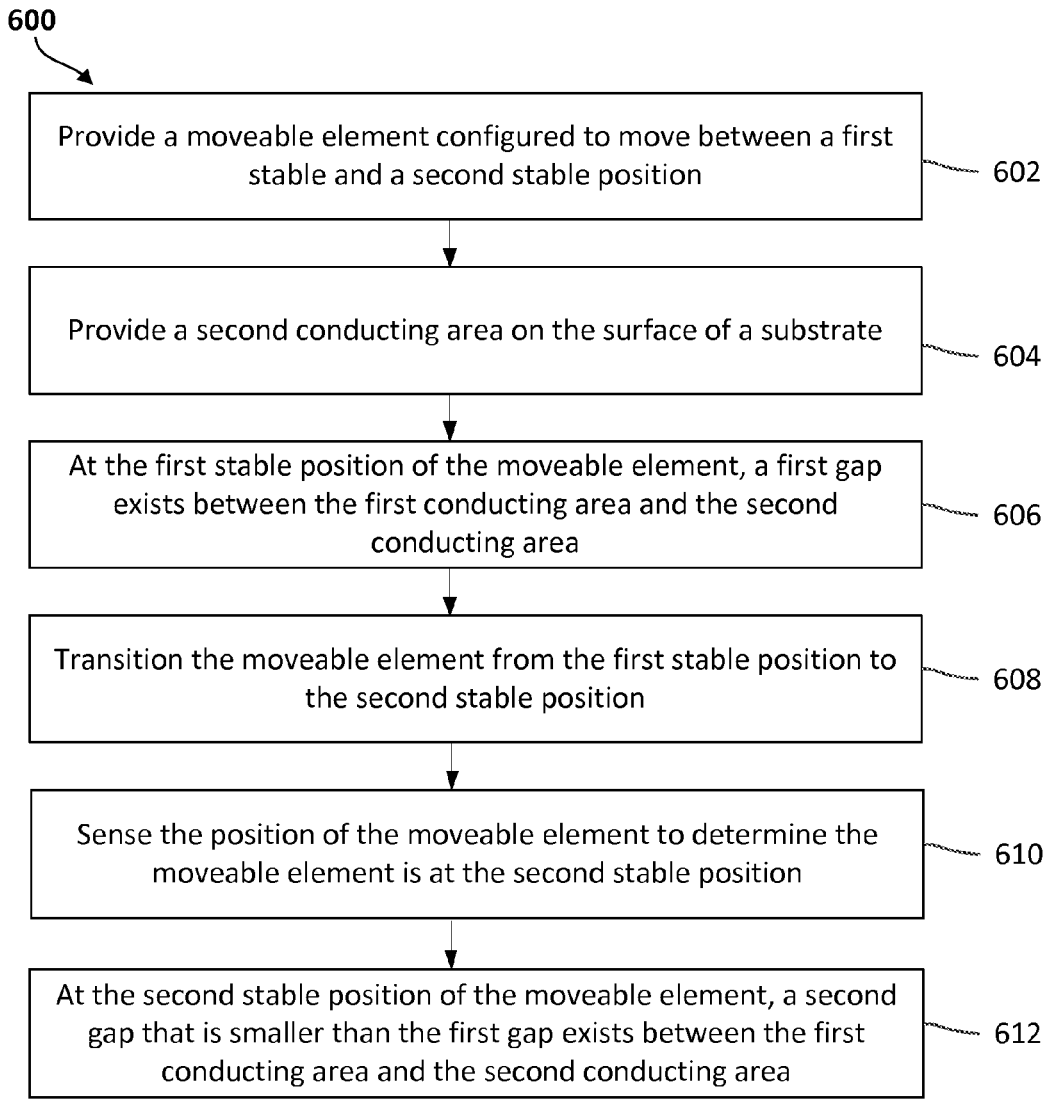
FIG. 6 is a flow diagram of a process for setting a digital memory device, according to one embodiment.

Referring to FIG. 6, a flow diagram of a process 600 for providing a digital memory cell is shown, according to one embodiment. In alternative embodiments, fewer, additional, and/or different actions may be performed. Also, the use of a flow diagram is not meant to be limiting with respect to the order of actions performed. A moveable element is provided that is configured to move between first and second stable positions in response to a Casimir force (602). The stable positions are generally relative to the digital memory device and the moveable element includes a first conducting area. A second conducting area is provided on the surface of a substrate (604). In the above discussed arrangement, when the moveable element is in the first stable position, a first gap exists between the first conducting area and the second conducting area (606). The moveable element can be transitioned from the first stable position to the second stable position is provided (608). Responsive to the change, a means for sensing the position of the moveable element is provided to determine when the moveable element is at the second or a different position (610). When the moveable element is in the second stable position, a second gap that is smaller than the first gap exists between the first conducting area and the second conducting area (612). The digital memory cell may be set and reset by positioning the moveable element between Casimir force dominated and non-Casimir force dominated states.

Figure 7:
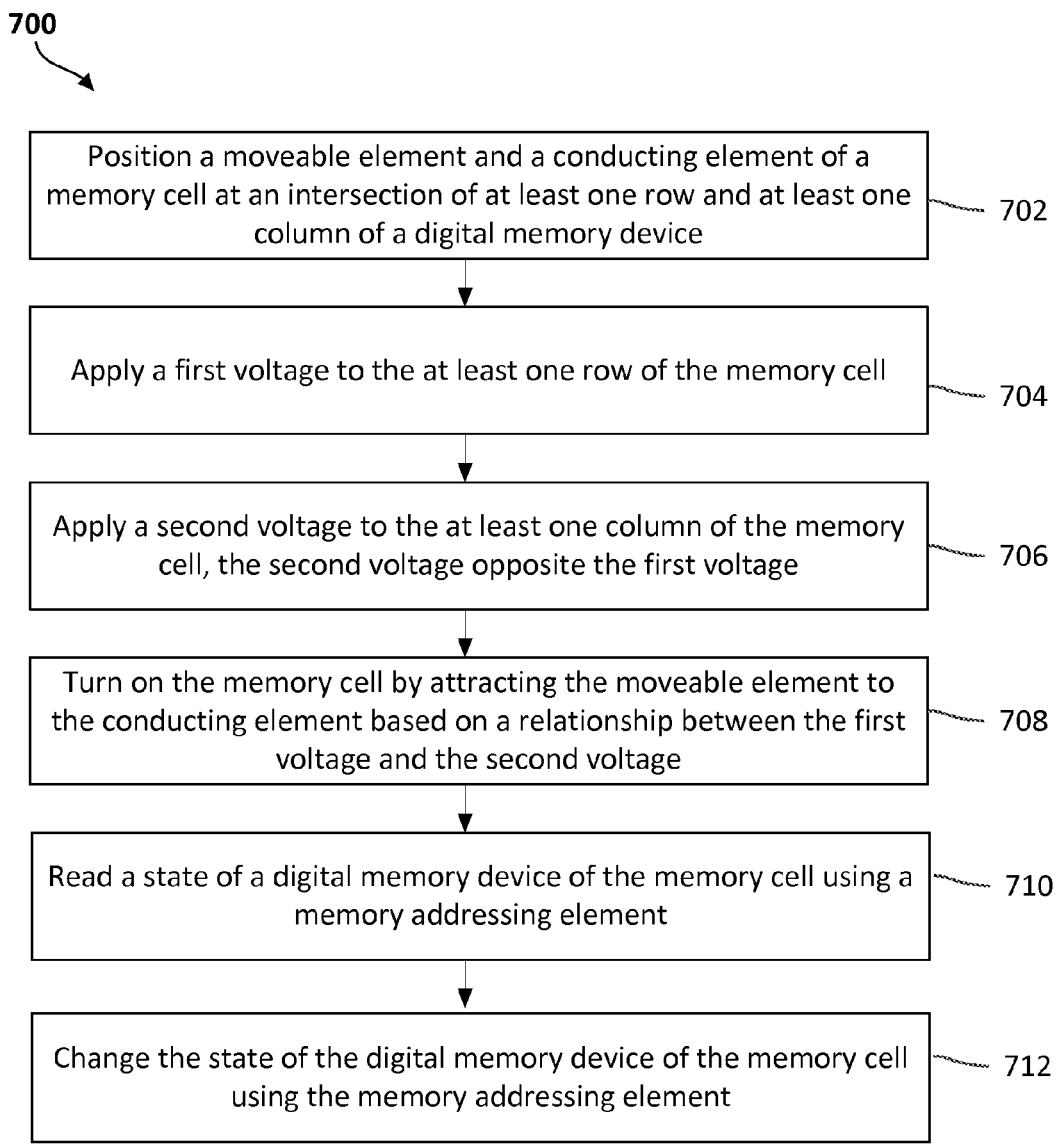
FIG. 7 is a flow diagram of a process for providing a digital memory cell, according to one embodiment.

Now referring to FIG. 7, a flow diagram of a process 700 for turning on a digital memory device is shown, according to one embodiment. The digital memory device can include a plurality of memory cells arranged into an array of rows and columns. The method includes positioning a moveable element and a conducting element of a Casimir effect memory cell at the intersection of each row and column (702). The rows may represent an X stripe on the memory cell and the columns may represent a Y stripe on the memory cell. For example, in some embodiments, the moveable element is coupled to at least one row (X stripe) and the conducting element (e.g., substrate) is coupled to at least one column (Y stripe). To set or turn on the memory cell, a voltage can be applied to the X stripe and the Y stripe. A first voltage can be applied to the at least one row (704). A second voltage can be applied to the at least one column (706). The first voltage and the second voltage can be opposite. For example, a −2V voltage may be applied to the X stripe and a +2V voltage may be applied to the Y stripe (or vice versa). To apply the voltages to the moveable element and the conducting element, an addressing mechanism of the digital memory device can be accessed. In some embodiments, the voltages are applied to a group or plurality of moveable elements and conducting elements. The memory cell can be activated (e.g., turned on) by attracting the moveable element to the conducting element based on a relationship (attraction) between the first voltage and the second voltage (708). The opposing voltage applied may cause the moveable element to move towards the conducting element along the Y stripe or column of the memory cell. Areas where portions of the moveable element and the conducting element interconnect can be set or turn on. In some embodiments, the rows and columns of the memory cell can be probed to determine a capacitance or position of the memory cell. The method further includes reading a state of the digital memory cell using a memory addressing element (710). Next, the state of the digital memory cell can be changed by accessing the memory addressing mechanism (712). The memory addressing mechanism may comprise a memory reading device configured to read a state of one or more digital memory devices of the array, and a memory writing device configured to change the state of the one or more digital memory cells of the array.

In other embodiments, to turn off the memory cell, the moveable element and the conducting element can be separated or moved apart from each other. For example, a third voltage can be applied to a second column. The second column can be opposite the column the second voltage was applied, such that the moveable element is posited between the two columns. The third voltage can be the same as the second voltage and opposite the first voltage. When the third voltage is applied to the second column, the moveable element becomes attracted to the second column and move away from or apart of the first column. This technique can be used to reset the memory cell or to turn the memory cell off.

Figure 8:
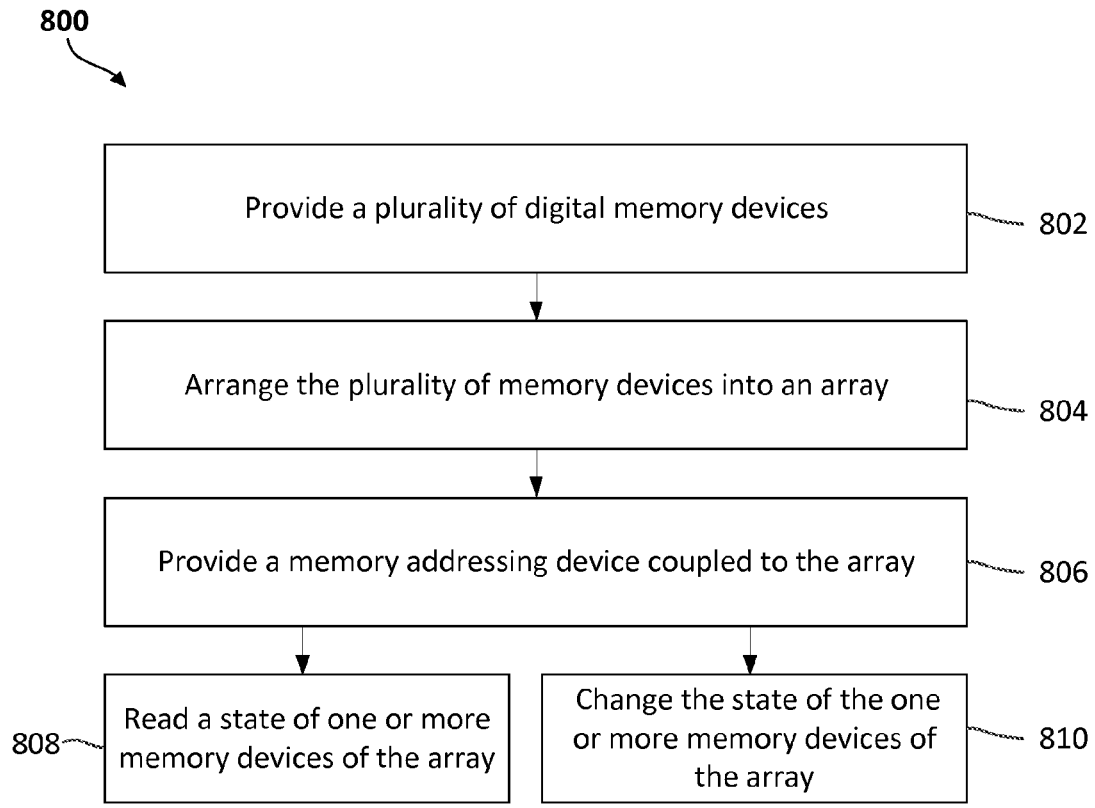
FIG. 8 is a flow diagram of a process for providing a data storage device, according to one embodiment.

Referring to FIG. 8, a flow diagram of a process 800 for providing a data storage device is shown, according to one embodiment. In alternative embodiments, fewer, additional, and/or different actions may be performed. Also, the use of a flow diagram is not meant to be limiting with respect to the order of actions performed. A plurality of Casimir memory devices is provided (802). Each Casimir memory device is a device as described herein, and includes a moveable element configured to move between first and second stable positions in response to a Casimir force. The stable positions are relative to the respective digital memory device, and the moveable element includes a first conducting area. A position of the moveable element represents a state of the particular Casimir memory device, and the state may be "set"/"on" and "reset"/"off". Each Casimir memory device also includes a second conducting area on the surface of a substrate. At the first stable position of the moveable element, a first gap exists between the first conducting area and the second conducting area. At the second stable position of the moveable element, a second gap that is larger than the first gap exists between the first conducting area and the second conducting area. The plurality of digital memory devices are connected together into an array (804). The array may be one-dimensional or multi-dimensional, such as a two-dimensional or three-dimensional array (e.g., a stack of two-dimensional layers), and the addressing mechanism may correspond to the configuration of the array. A memory addressing mechanism is provided and is coupled to the array (806). The memory addressing mechanism includes a memory reading element configured to read a state of one or more digital memory devices of the array (808), and a memory writing element configured to change the state of the one or more digital memory devices of the array (810). The memory addressing mechanism may be one-dimensional (e.g., a row or matrix of read/write probes). As another example, the memory addressing mechanism may be two-dimensional or three-dimensional (e.g., using a coincident current or active device).

In some embodiments, a multi-dimensional digital memory device comprises a stack of multiple memory devices, each memory device making up one layer of the stack. For example, a layer, or a memory device in the stack may include a substrate, a spacer to prevent contact between the moveable element and the substrate, and a support element to support the moveable element. In other embodiments, a layer, or a memory device in the stack may include a moveable element, a substrate, a dielectric, a reset layer, and then a thick spacer. In still another embodiment, a layer, or a memory device in the stack may include a substrate, a spacer, a moveable element, a substrate, and a moveable element. In this embodiment, the substrate may act as a reset layer for the moveable element.

The multi-dimensional digital memory device can be addressable in both an X-axis and Y-axis. For example, the multi-dimensional digital memory device including the stack of memory cells can be formed into a cube shape with the ends of the XY intersects exposed on a face of the cube shape to create XY matrices. The XY matrices can be probed to read a state of the multi-dimensional digital memory device and probed to write to change a state of the multi-dimensional digital memory device.

The data storage device provided by process 800 may be configured as RAM, ROM (e.g., PROM, EPROM), sequentially-accessed memory, or otherwise constrained memory. For example, in a RAM configuration, the memory addressing mechanism may be configured to randomly select the one or more digital memory devices of the array to change in order to write data.

The array may be a one-dimensional, two-dimensional, or three-dimensional array (e.g., a stack of two-dimensional layers), and the addressing mechanism may correspond to the configuration of the array. For example, the addressing mechanism may be one-dimensional (e.g., a row or matrix of read/write probes). As another example, the addressing mechanism may be two-dimensional or three-dimensional (e.g., using a coincident current or active device).

The construction and arrangement of the systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the embodiments without departing from the scope of the present disclosure.

The present disclosure contemplates methods, systems and program products on any machine-readable media for accomplishing various operations. The embodiments of the present disclosure may be implemented or modeled using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. All such variations are within the scope of the disclosure. Likewise, software implementations could be accomplished with standard programming techniques with rule-based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A digital memory device, comprising:
  a moveable element configured to move between a first stable position and a second stable position, wherein the moveable element comprises a first conducting area; and
  a second conducting area on the surface of a substrate;
  wherein at the first stable position of the moveable element, a first gap exists between the first conducting area and the second conducting area, and
  wherein at the second stable position of the moveable element, a second gap that is larger than the first gap exists between the first conducting area and the second conducting area, and
  wherein in at least the first stable position an attractive Casimir force between the moveable element and the substrate holds the moveable element in the stable position;
  wherein an area of the moveable element is between 10 nanometers$^2$ and 1000 nanometers$^2$.

2. The digital memory device of claim 1, wherein the first conducting area comprises a surface of a conducting disk, and wherein the moveable element is configured to move in a perpendicular manner with respect to the second conducting area.

3. The digital memory device of claim 1, wherein the second gap is 10 nanometers or less.

4. The digital memory device of claim 1, wherein the second gap is 1 nanometer or less.

5. The digital memory device of claim 1, wherein the moveable element comprises a portion of a contiguous sheet.

6. The digital memory device of claim 1, wherein the moveable element comprises a portion of a partially separated sheet that is connected to the device by one or more supporting elements.

7. The digital memory device of claim 1, wherein the moveable element comprises an isolated element that is surrounded by a gap and the one or more supporting elements.

8. The digital memory device of claim 1, wherein the moveable element is further configured to be maintained in the second position in part by a mechanical elastic strain force of a material supporting the moveable element.

9. The digital memory device of claim 1, wherein the first gap is defined by one or more spacer elements.

10. The digital memory device of claim 1, wherein the moveable element is further configured to move between the first and second stable positions in response to an additional force.

11. The digital memory device of claim 10, wherein the additional force includes at least one of an electromagnetic force, an electrostatic force, a mechanical force, photon pressure, and a second Casimir force from a second moveable element.

12. The digital memory device of claim 1, wherein a state of the moveable element is configured to be determined by measuring one or more properties of the digital memory device.

13. The digital memory device of claim 12, wherein the one or more properties of the digital memory device includes at least one of an electrical conductance, a resistance, a capacitance, a thermal conductance, an optical reflection or transmission, and a mechanical position.

14. The digital memory device of claim 1, wherein the moveable element is configured to rest in only the first or second stable positions.

15. The digital memory device of claim 1, further comprising one or more intermediate stable positions between the first and second stable positions, and wherein the moveable element is further configured to move between the one or more intermediate stable positions.

16. The digital memory device of claim 1, wherein the Casimir force on the moveable element can be varied by changing on or more properties of the first conducting area or the second conducting area.

17. The digital memory device of claim 1, further comprising a second substrate comprising a third conducting area, wherein the movable element is positioned between the second substrate and the substrate.

18. The digital memory device of claim 1, further comprising an electrical contact coupled to the moveable element, wherein the electrical contact provides an indication of at least one of a capacitance charge or a resistance charge of a position of the moveable element.

19. The digital memory device of claim 1, wherein the digital memory device is coupled to one or more additional digital memory devices to form an array of digital memory devices, wherein the array is an two-dimensional array or three-dimensional array.

20. The digital memory device of claim 19, wherein the three-dimensional array is a stack of two-dimensional layers.

21. A digital data storage device, comprising:
plurality of digital memory devices connected together in an array, wherein at least one digital memory device comprises:
  a moveable element configured to move between a first stable position and a second stable position, wherein a position of the moveable element represents a state of a particular digital memory device, and wherein the moveable element comprises a first conducting area; and
  a second conducting area on the surface of a substrate;
wherein at the first stable position of the moveable element, a first gap exists between the first conducting area and the second conducting area,
wherein at the second stable position of the moveable element, a second gap that is smaller than the first gap exists between the first conducting area and the second conducting area, and
wherein in at least the second stable position, an attractive Casimir force between the moveable element and the substrate holds the moveable element in the stable position; and
a memory addressing mechanism comprising:
  a memory reading mechanism configured to read a state of one or more digital memory devices of the array; and
  a memory writing mechanism configured to change the state of the one or more digital memory devices of the array;
  wherein the array is a two-dimensional array, and the addressing mechanism is a two-dimensional addressing mechanism.

22. The digital data storage device of claim 21, wherein changing the state of the one or more digital memory devices is in one direction and is irreversible.

23. The digital data storage device of claim 21, wherein changing the state of the one or more digital memory devices is in one direction and is reversible.

24. The digital data storage device of claim 21, wherein changing the state of the one or more digital memory devices is in either direction, and wherein the memory writing mechanism is configured to provide random access to the one or more digital memory devices of the array to change.

25. The digital data storage device of claim 21, wherein changing the state of the one or more digital memory devices is in either direction, and wherein the memory writing mechanism is configured to sequentially select the one or more digital memory devices of the array to change.

26. The digital data storage device of claim 21, wherein the addressing mechanism is a one-dimensional addressing mechanism comprising a matrix of read/write probes.

27. The digital data storage device of claim 21, wherein the array is a three-dimensional array.

28. The digital data storage device of claim 21, wherein the addressing mechanism is a scanning device.

29. The digital data storage device of claim 21, further comprising a second substrate comprising a third conducting area, wherein the movable element is positioned between the second substrate and the substrate.

30. The digital data storage device of claim 21, further comprising an electrical contact coupled to the moveable element, wherein the electrical contact provides an indication of at least one of a capacitance charge or a resistance charge of a position of the moveable element.

31. The digital data storage device of claim 21, wherein the array is a two-dimensional array or three-dimensional array.

32. A digital data storage device, comprising:
a plurality of digital memory devices connected together in an array, wherein at least one digital memory device comprises:
  a moveable element configured to move between a first stable position and a second stable position, wherein a position of the moveable element represents a state of a particular digital memory device, and wherein the moveable element comprises a first conducting area; and
  a second conducting area on the surface of a substrate;
wherein at the first stable position of the moveable element, a first gap exists between the first conducting area and the second conducting area,
wherein at the second stable position of the moveable element, a second gap that is smaller than the first gap exists between the first conducting area and the second conducting area, and
wherein in at least the second stable position, an attractive Casimir force between the moveable element and the substrate holds the moveable element in the stable position; and
a memory addressing mechanism comprising:
  a memory reading mechanism configured to read a state of one or more digital memory devices of the array; and
  a memory writing mechanism configured to change the state of the one or more digital memory devices of the array;
wherein the addressing mechanism is a single-point addressing mechanism.

* * * * *